US012568673B2

(12) United States Patent (10) Patent No.: US 12,568,673 B2
Yang et al. (45) Date of Patent: Mar. 3, 2026

(54) LATERAL SURFACE GATE VERTICAL FIELD EFFECT TRANSISTOR WITH ADJUSTABLE OUTPUT CAPACITANCE

(71) Applicant: Power Integrations, Inc., San Jose, CA (US)

(72) Inventors: Kuo-Chang Robert Yang, Campbell, CA (US); Sorin S. Georgescu, Gilroy, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 316 days.

(21) Appl. No.: 18/030,029

(22) PCT Filed: Sep. 28, 2021

(86) PCT No.: PCT/US2021/052376
§ 371 (c)(1),
(2) Date: Apr. 3, 2023

(87) PCT Pub. No.: WO2022/076199
PCT Pub. Date: Apr. 14, 2022

(65) Prior Publication Data
US 2023/0369432 A1 Nov. 16, 2023

Related U.S. Application Data

(60) Provisional application No. 63/087,433, filed on Oct. 5, 2020.

(51) Int. Cl.
*H01L 29/423* (2006.01)
*H10D 30/47* (2025.01)
(Continued)

(52) U.S. Cl.
CPC ......... *H10D 64/513* (2025.01); *H10D 30/477* (2025.01); *H10D 62/8325* (2025.01); *H10D 62/8503* (2025.01)

(58) Field of Classification Search
None
See application file for complete search history.

(56) References Cited

U.S. PATENT DOCUMENTS

| 5,326,711 A | 7/1994 | Malhi |
| 7,067,870 B2 | 6/2006 | Omura et al. |

(Continued)

FOREIGN PATENT DOCUMENTS

| CN | 1667838 A | 9/2005 |
| CN | 102194819 A | 9/2011 |

(Continued)

OTHER PUBLICATIONS

Riccardo Pittini et al: "SiC JFET cascade loss dependency on the MOSFET output capacitance and performance comparison with Trench IGBTs", Applied Power Electronics Conference and Exposition (APEC), 2013 Twenty-Eighth Annual IEEE, Mar. 17, 2013, pp. 1287-1293.

(Continued)

*Primary Examiner* — William C Trapanese
(74) *Attorney, Agent, or Firm* — Brian H. Floyd

(57) ABSTRACT

A lateral surface gate vertical field effect transistor with adjustable output capacitance is described herein. The lateral surface gate vertical field effect transistor includes both a lateral gate and a trench gate. The lateral gate modulates a surface channel and the trench gate includes a controllable depth. The controllable depth may be varied to advantageously adjust output capacitance.

24 Claims, 18 Drawing Sheets

(51) Int. Cl.
  H10D 62/832     (2025.01)
  H10D 62/85      (2025.01)
  H10D 64/27      (2025.01)

(56)           References Cited

U.S. PATENT DOCUMENTS

| | | | |
|---|---|---|---|
| 2002/0030237 A1 | 3/2002 | Omura et al. | |
| 2006/0001084 A1* | 1/2006 | Kelly | H10D 30/668 |
| | | | 257/E29.264 |
| 2009/0114980 A1 | 5/2009 | Pang | |
| 2012/0175679 A1* | 7/2012 | Marino | H10D 64/411 |
| | | | 257/E21.417 |
| 2013/0221429 A1 | 8/2013 | Yang | |
| 2016/0104766 A1 | 4/2016 | Kelkar et al. | |
| 2016/0218099 A1 | 7/2016 | Ikeda | |
| 2020/0243426 A1 | 7/2020 | Montgomery et al. | |
| 2020/0303514 A1 | 9/2020 | Liu et al. | |
| 2021/0210484 A1 | 7/2021 | Kono | |

FOREIGN PATENT DOCUMENTS

| | | | | |
|---|---|---|---|---|
| CN | 105280713 A | 1/2016 | | |
| CN | 107369713 A | 11/2017 | | |
| EP | 1168455 A2 | 1/2002 | | |
| EP | 1703566 A1 * | 9/2006 | | H10D 30/611 |
| JP | H077149 A | 1/1995 | | |
| JP | 2002083963 A | 3/2002 | | |
| JP | 2003243655 A | 8/2003 | | |
| JP | 2005204362 A | 7/2005 | | |
| JP | 2006501666 A | 1/2006 | | |
| JP | 2016139997 A | 8/2016 | | |
| JP | 2020077742 A | 5/2020 | | |
| TW | 200535949 A | 11/2005 | | |
| WO | 2004032243 A1 | 4/2004 | | |
| WO | 2020095899 A1 | 5/2020 | | |

OTHER PUBLICATIONS

PCT Application No. PCT/US2021/052376; International Search Report and Written Opinion of the International Searching Authority; Dec. 23, 2021; 11 pages.

European Application Serial No. 21795180.5, Communication pursuant to Article 94(3) EPC mailed Dec. 20, 2024; 8 pages.

Japanese Patent Application No. 2023-520213; Notice of Reasons for Refusal with Machine Translation mailed Apr. 1, 2025, 14 pages.

Taiwanese Application Serial No. 110136848, Non-Final Office Action and Search Report with Machine Translation mailed Jan. 17, 2025; 11 pages.

Taiwanese Application Serial No. 110132699, First Office Action mailed Apr. 23, 2025, with Search Report and Machine Translation 17 pages.

Taiwanese Application Serial No. 110132699, Office Action mailed Aug. 20, 2025, with Search Report and Machine Translation, 17 pages.

Taiwanese Application Serial No. 110136848, Decision of Rejection with Machine Translation, May 16, 2025, 12 pages.

Japanese Application Serial No. 2023-520213, Decision to Grant a Patent with Machine Translation, Aug. 18, 2025, 7 pages.

Search Report for Chinese application No. 2021800684165, with Machine Translation, dated Dec. 16, 2025, 7 pages.

Office Action for Chinese application No. 2021800684165, with Machine Translation, dated Dec. 30, 2025, 10 pages.

Taiwanese Application Serial No. 110132699, Office Action mailed Dec. 17, 2025 with Search Report and Machine Translation, 20 pages.

* cited by examiner

100

CASCODE
DRAIN

101

HIGH VOLTAGE
DEVICE

102

APPLIED GATE
VOLTAGE

CASCODE
SOURCE

400

700

LATERAL SURFACE GATE VERTICAL FIELD EFFECT TRANSISTOR WITH ADJUSTABLE OUTPUT CAPACITANCE

CROSS-REFERENCE TO RELATED APPLICATIONS

This application is a National Stage Entry of International Application No. PCT/US2021/052376 filed on Sep. 28, 2021, which claims the benefit of U.S. Provisional Application No. 63/087,433 filed on Oct. 5, 2020, the contents of which are incorporated in their entirety herein by reference.

FIELD OF THE DISCLOSURE

The present disclosure relates generally to vertical field effect transistors, and more specifically to vertical field effect transistors with trenches.

BACKGROUND INFORMATION

A field effect transistor allows the flow of majority carriers, majority carrier current, through a channel. The conductivity of the channel is modulated by a gate bias. Under forward bias conditions the channel conducts current, and under reverse bias conditions the channel blocks current. In a lateral field effect transistor the channel is formed at the surface, and current flows laterally.

In a vertical trench gate field effect transistor, a trench gate is fabricated in a field effect transistor by etching trenches into an active region. Gate channel regions are formed vertically along the walls of the trench to gate current in the vertical direction. The gate channel blocks current under a reverse biasing applied gate potential and facilitates current under a forward biasing applied gate potential. An advantage of vertical trench gates is the confinement of current to the vertical direction.

A field effect transistor can be characterized by input capacitance, output capacitance, and reverse transfer capacitance. Input capacitance is determined by gate-to-drain and gate-to-source capacitance. Output capacitance is determined by drain-to-source and gate-to-drain capacitance; and reverse transfer capacitance is determined by gate-to-drain capacitance.

BRIEF DESCRIPTION OF THE DRAWINGS

Non-limiting and non-exhaustive embodiments of a lateral surface gate vertical field effect transistor with adjustable output capacitance are described with reference to the following figures, wherein like reference numerals refer to like parts throughout the various views unless otherwise specified.

Figure 1:
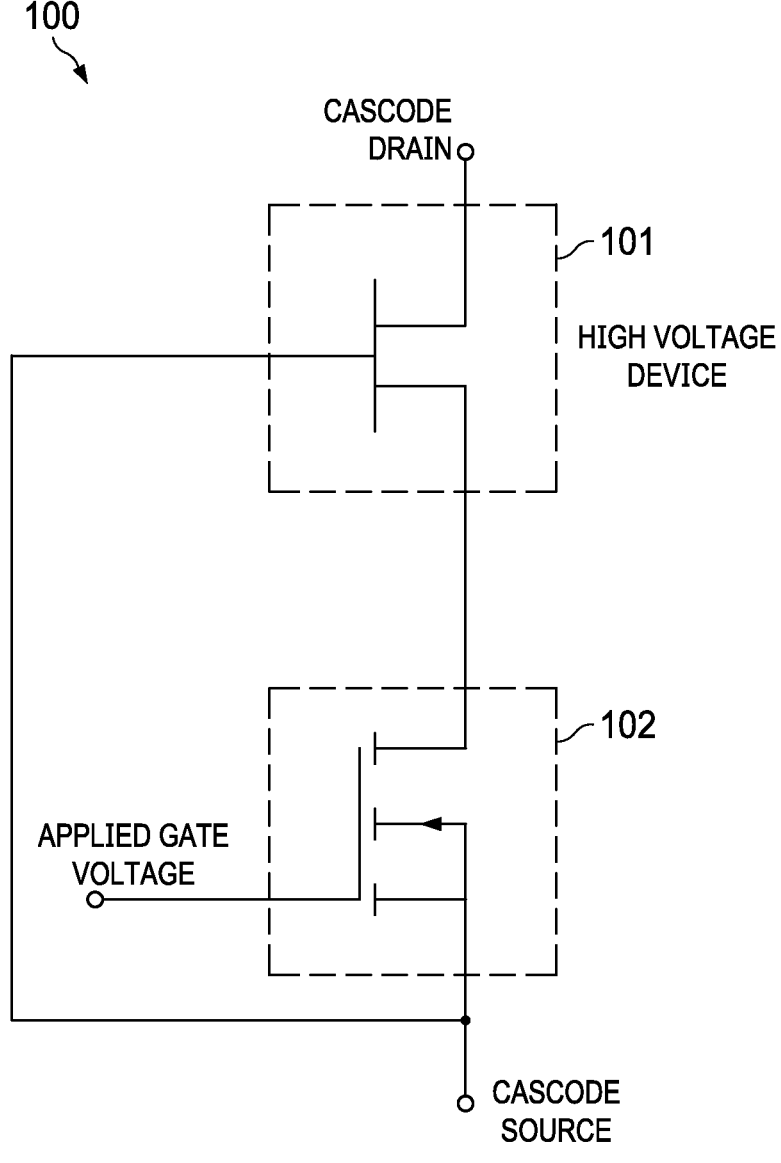
FIG. 1 illustrates a schematic of a cascode device comprising a lateral surface gate vertical field effect transistor with adjustable output capacitance according to the teachings herein.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements and layers in the figures may be exaggerated relative to other elements to help to improve understanding of various embodiments of the teachings herein. Also, common but well-understood elements, layers, and/or process steps that are useful or necessary in a commercially feasible embodiment are often not depicted in order to facilitate a less obstructed view of these various embodiments of a lateral surface gate vertical field effect transistor with adjustable output capacitance.

DETAILED DESCRIPTION

In the following description, numerous specific details are set forth in order to provide a thorough understanding of a lateral surface gate vertical field effect transistor with adjustable output capacitance. It will be apparent, however, to one having ordinary skill in the art that the specific detail need not be employed to practice the teachings herein. In other instances, well-known materials or methods have not been described in detail in order to avoid obscuring the present disclosure.

Reference throughout this specification to "one embodiment", "an embodiment", "one example" or "an example" means that a particular feature, structure, method, process, and/or characteristic described in connection with the embodiment or example is included in at least one embodiment of a lateral surface gate vertical field effect transistor with adjustable output capacitance. Thus, appearances of the phrases "in one embodiment", "in an embodiment", "one example" or "an example" in various places throughout this specification are not necessarily all referring to the same embodiment or example. Furthermore, the particular features, structures, methods, processes and/or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

In the context of the present application when a transistor, including a field effect transistor, is in an "off-state" or "off" the transistor blocks current and/or does not substantially conduct current. Conversely, when a transistor is in an "on-state" or "on" the transistor is able to substantially conduct current. Also, for purposes of this disclosure, "ground" or "ground potential" refers to a reference voltage or potential against which all other voltages or potentials of an electronic circuit, device, or Integrated circuit (IC) are defined or measured.

A field effect transistor may also be categorized by the maximum voltage at which it can operate and block current. For instance, a field effect transistor designed to block and/or to operate with high voltages (e.g., at hundreds of volts) may be classified as a high voltage field effect transistor, while a field effect transistor designed to block and/or to operate with low voltages (e.g., thirty to fifty volts) may be classified as a low voltage field effect transistor.

Additionally, field effect transistors (FETs) can be enhancement mode or depletion mode. An enhancement mode device may refer to a transistor (e.g., a field effect transistor) which blocks current (i.e., which is off) when there is no applied gate bias (i.e., when the gate to source bias is zero). In contrast, a depletion mode device may refer to a transistor which allows current (i.e., which is on) when the gate to source bias is zero.

Also within the context of the present application a field effect transistor can be realized as a metal oxide semiconductor field effect transistor (MOSFET). Field effect transistors and MOSFETs, including low voltage MOSFETs, can be paired with high-voltage depletion-mode Gallium Nitride (GaN) or Silicon Carbide (SiC) devices to create high voltage cascode devices. For instance, a high-voltage cascode device can comprise a high voltage depletion mode GaN high-electron mobility transistor (HEMT) cascoded with a low voltage enhancement mode MOSFET.

Compared to a discrete high voltage field effect transistor, a high voltage cascode device may advantageously have improved reverse recovery characteristics. For instance, a cascode device including a low voltage enhancement mode field effect transistor and/or MOSFET avails a body diode in the low voltage MOSFET (i.e., low voltage field effect transistor). The body diode of the low voltage MOSFET may avail ultra low reverse recovery charge Qrr and superior reverse recovery characteristics otherwise not available from a single discrete high voltage field effect transistor.

Additionally, it is desirable to reduce the on resistance Rdson and to control output capacitance Coss in the low voltage field effect transistor of a high voltage cascode device. For instance, reducing the on-resistance of the low voltage field effect transistor improves the total on-state characteristics of the high voltage cascode device.

Also, having control over the output capacitance Coss may enhance switching performance. For instance, the output capacitance Coss together with the drain-to-source capacitance Cds of the high voltage depletion mode GaN or SiC device influence switching. Having control over output capacitance Coss may advantageously avail control over the voltage excursions at the source of the high voltage cascode device.

Modern high voltage cascode devices use lateral low voltage enhancement mode field effect transistors. Unfortunately, lateral low voltage enhancement mode field effect transistors are typically metal limited due to non-scaling backend metal resistance. For instance, a typical lateral low voltage enhancement mode field effect transistor may be limited to a minimum on resistance of approximately fifteen milliohms (15 mohm) due to metal resistance.

Moreover, lateral low voltage enhancement mode field effect transistors do not allow control over output capacitance Coss. Accordingly, there is a need for an improved low voltage enhancement mode field effect transistor which avails lower on resistance and control over output capacitance Coss.

A lateral surface gate vertical field effect transistor with adjustable output capacitance is described herein. The lateral surface gate vertical field effect transistor includes both a lateral gate and a trench gate. The lateral gate modulates a surface channel and the trench gate includes a controllable depth. The controllable depth may be varied to advantageously adjust output capacitance.

FIG. 1 illustrates a schematic of a cascode device 100 comprising a lateral surface gate vertical field effect transistor 102 with adjustable output capacitance according to the teachings herein. The cascode device 100 further comprises a high voltage device 101. The high voltage device 101 can be a depletion mode gallium nitride high electron mobility transistor. Alternatively, the high voltage device 101 can be a depletion mode silicon carbide field effect transistor or silicon carbide junction field effect transistor.

As discussed above, advantages of the high voltage cascode device 100 may include low or ultra-low reverse recovery charge Qrr and superior reverse recovery characteristic provided by a body diode of the lateral surface gate vertical field effect transistor 102. Also as discussed herein, another important parameter is output capacitance Coss of the lateral surface gate vertical field effect transistor 102. The output capacitance Coss together with the drain-to-source capacitance Cds of the high voltage device 101 may determine how high the source voltage of the high voltage device 101 rises during switching.

According to the teachings herein, the lateral surface gate vertical field effect transistor 102 may avail better on-resistance Rdson compared to a lateral low-voltage metal oxide field effect transistor (MOSFET). For instance, the on-resistance Rdson may be less than fifteen milliohms (15 mohm). In other applications the on-resistance Rdson may be less than ten milliohms (10 mohm).

Figure 2:
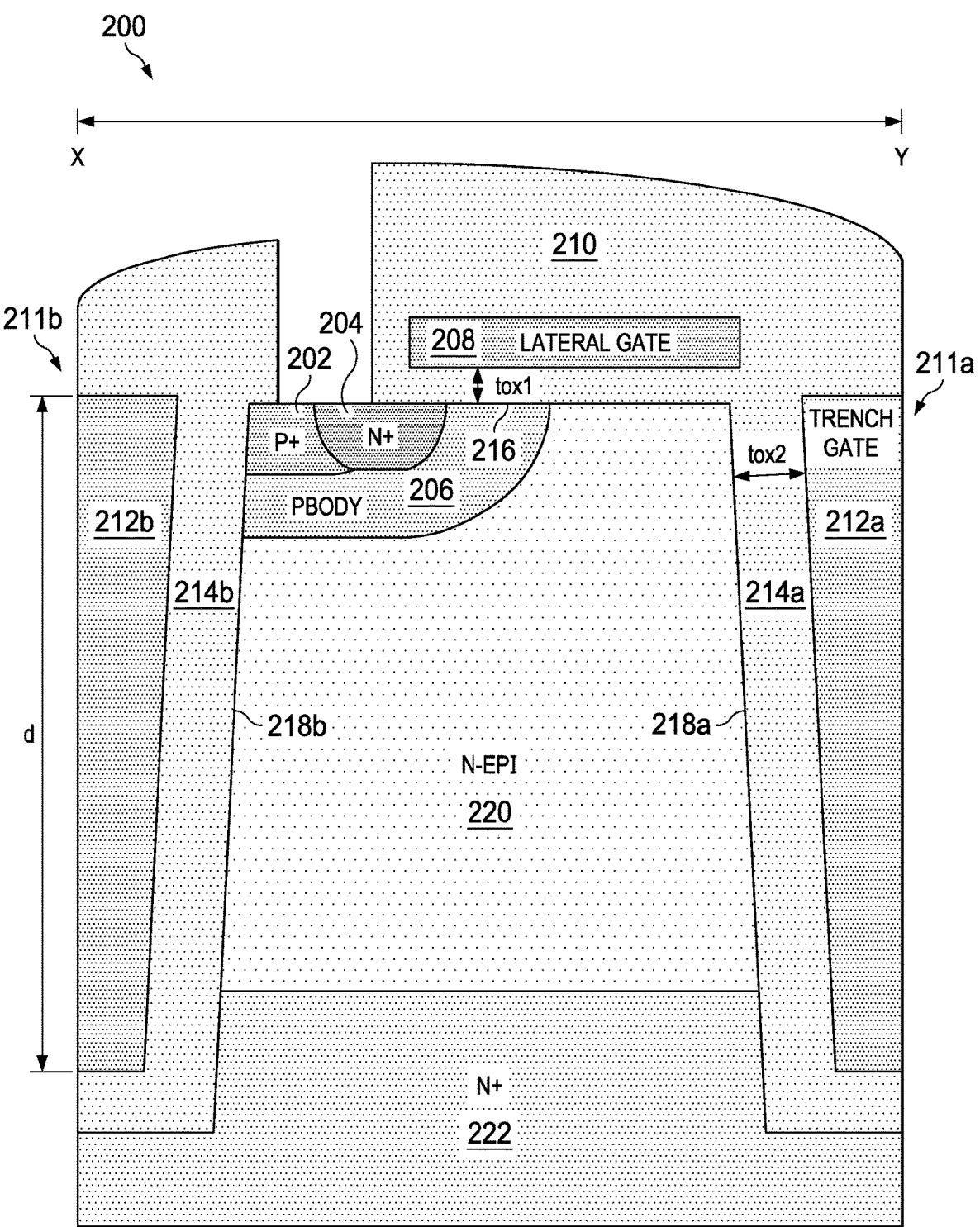
FIG. 2 illustrates a cross section of an active cell of a lateral surface gate vertical field effect transistor with adjustable output capacitance according to an embodiment.

FIG. 2 illustrates a cross section of an active cell 200 of a lateral surface gate vertical field effect transistor 102 with adjustable output capacitance according to an embodiment. The active cell 200 includes a heavily doped N-type (N+) substrate 222, an N-type epitaxial (N-EPI) layer 220, a P-type body (PBODY) diffusion 206, a heavily doped P-type (P+) body contact diffusion 202, and a heavily doped N-type (N+) source diffusion 204. The N-EPI layer 220 may be grown with a graded or constant doping profile on the substrate 222.

The active cell 200 includes trenches 211a-b extending through the N-EPI layer 220 and into the N+ substrate 222. Trench 211a includes oxide 214a and a trench gate 212a; and trench 211b includes oxide 214b and a trench gate 212b. Additionally, oxides 214a-b may have thickness tox2 and trench gates 212a-b may extend a depth d through the N-EPI layer 220. According to the embodiment of active cell 200, the trenches 211a-b extend a depth d through the N-EPI layer 220 and into the N+ substrate 222.

The active cell 200 also includes a lateral gate 208 which is disposed on a surface gate oxide 210 of thickness tox1. The lateral gate 208 extends laterally over the surface gate oxide 210 and avails field control at an interface 216. According to an embodiment, the lateral gate 208 and the trench gates 212a-b can comprise polysilicon (e.g., N-type polysilicon). In another embodiment the gate oxide 210 and the oxides 214a-b may be of the same material and of the same thickness (i.e., thickness tox1 may equal or be substantially equal to thickness tox2).

A gate voltage may be applied to the lateral gate 208 to modulate a channel (i.e., a surface channel) formed at the interface 216 between the N-type source diffusion 204 and the N-EPI layer 220. According to the teachings herein, the active cell 200 may be an active cell in a lateral surface gate vertical field effect transistor 102 which operates in enhancement mode. Therefore, for gate-to-source voltages greater than an enhancement threshold (e.g. positive two volts), current may flow along a channel at the interface 216; conversely, for gate-to-source voltages less than the enhancement threshold, current may be blocked.

According to semiconductor device physics, a drain of the lateral surface gate vertical field effect transistor 102 may comprise the N-EPI layer 220 and the N+ substrate 222. Current flow in the N-EPI layer 220 and N+ substrate 222 may be vertical. Additionally, the trenches 211a-b may be electrically coupled to the lateral gate 208 so that a voltage applied to the lateral gate 208 is substantially equal to a voltage applied to the trench gates 212a-b. In this way an improvement in on-resistance Rdson may be realized by availing conductivity modulation at the trench interfaces 218a-b. For instance, low resistance accumulation regions may form along the trench interfaces 218a-b when a positive gate potential is applied to the trench gates 212a-b.

Also according to semiconductor device physics and device design, the active cell 200 may be designed for low voltage (i.e., for low drain-to-source voltages). For instance, a typical maximum drain-to-source voltage may be forty volts. In some applications the maximum breakdown voltage of the drain-to-source may be fifty to sixty volts.

Figure 3:
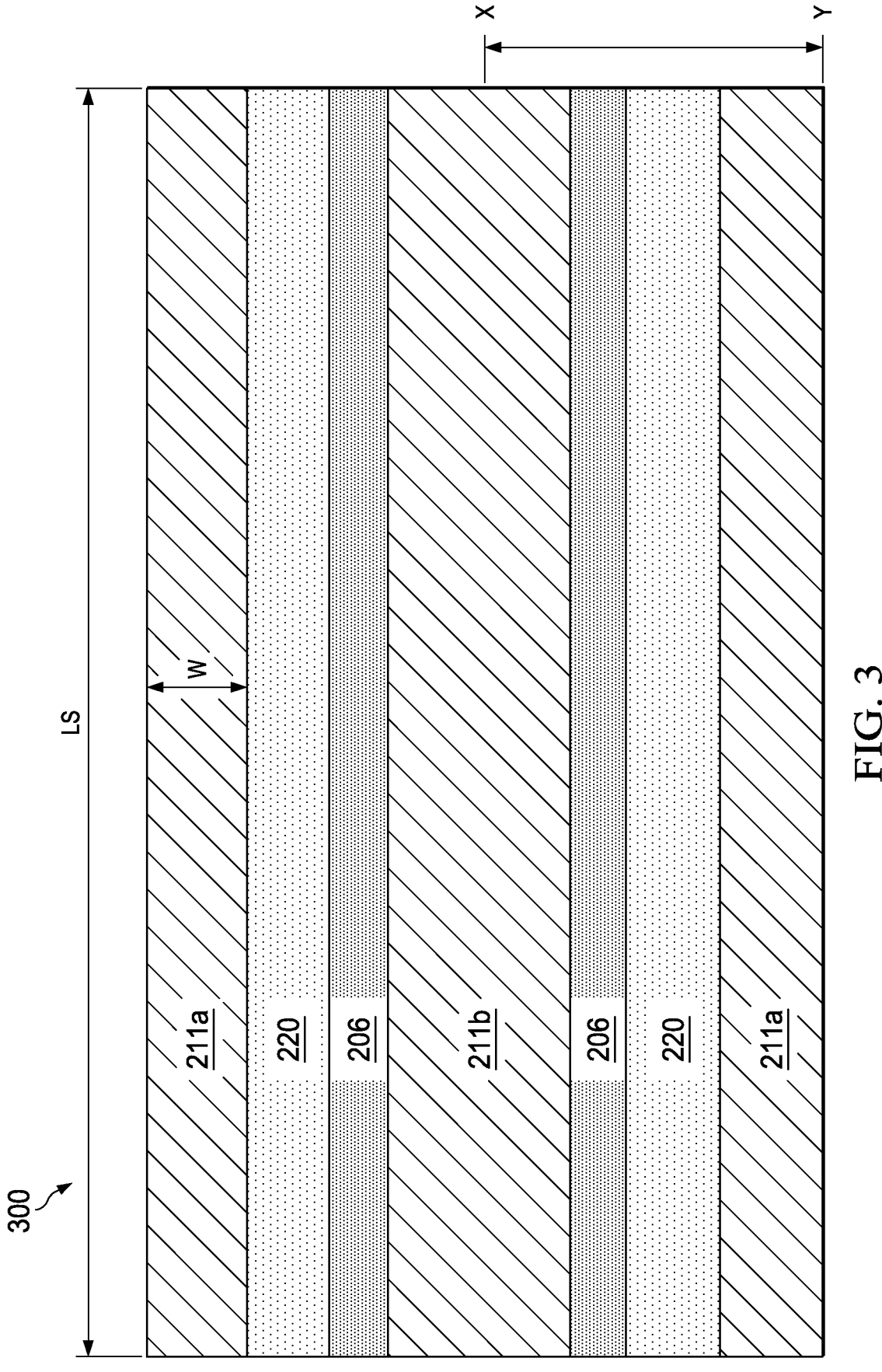
FIG. 3 illustrates a top view of a partial stripe cell layout according to an embodiment of the lateral surface gate vertical field effect transistor of FIG. 2.

FIG. 3 illustrates a top view of a partial stripe cell layout 300 according to an embodiment of the lateral surface gate vertical field effect transistor 102. The partial stripe cell layout 300 includes the trenches 211a-b and the PBODY diffusion 206 drawn with respect to the N-EPI layer 220. For reference a cross section delineated from point X to point Y may correspond with the cross section of active cell 200 shown in FIG. 2. As illustrated, the trenches 211a-b with PBODY diffusion 206 extend a distance LS across; and the trench 211a may have a width W. In some embodiments the width W may be between three hundred nanometers (300 nm) and one point two microns (1.2 um). For instance, in one embodiment the width W may be seven hundred and fifty nanometers (750 nm).

Figure 4A:
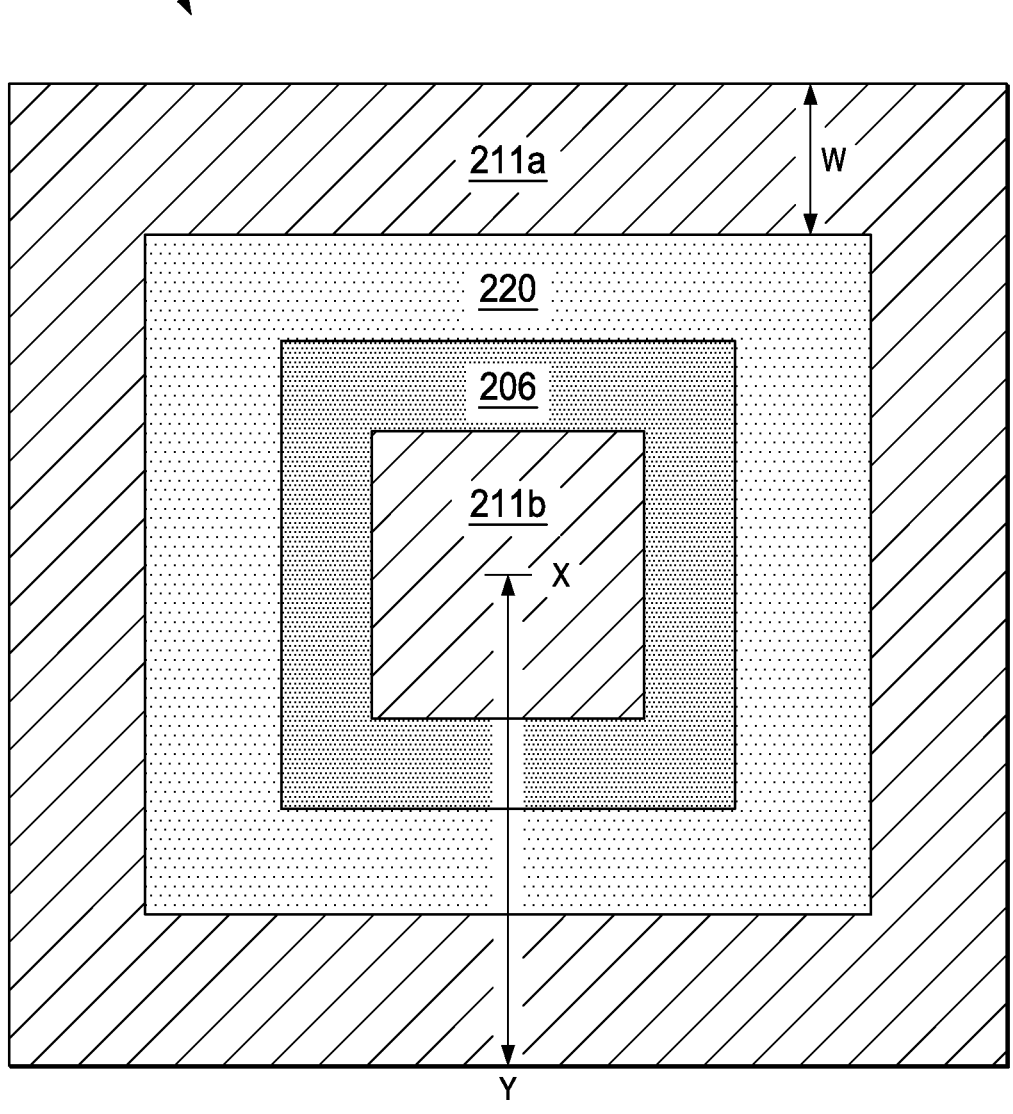
FIG. 4A illustrates a top view of a closed cell layout according to an embodiment of the lateral surface gate vertical field effect transistor of FIG. 2.

FIG. 4A illustrates a top view of a closed cell layout 400 according to an embodiment of the lateral surface gate vertical field effect transistor 102. The closed cell layout 400 includes the trenches 211a-b and the PBODY diffusion 206 drawn with respect to the N-EPI layer 220. For reference the cross section delineated from point X to point Y may correspond with the cross section of active cell 200 shown in FIG. 2. As illustrated, the trench 211a may have width W (e.g., width W between 300 nm and 1.2 um).

Figure 4B:
FIG. 4B illustrates a top view showing a cell placement pattern of the closed cell layout of FIG. 4A.

FIG. 4B illustrates a top view showing a cell placement pattern 450 of the closed cell layout 400 of FIG. 4A. The cell placement pattern 450 includes closed cell layout instances 400a-f duplicating cell layout 400. As indicated by the ellipses 460 and 462 there can be greater than six instances 400a-f. As one of ordinary skill in the art may appreciate, there can be greater or fewer than six instances 400a-f based, at least in part, upon the maximum specified drain-to-source current and/or upon the maximum specified on resistance Rdson.

Figure 5A:
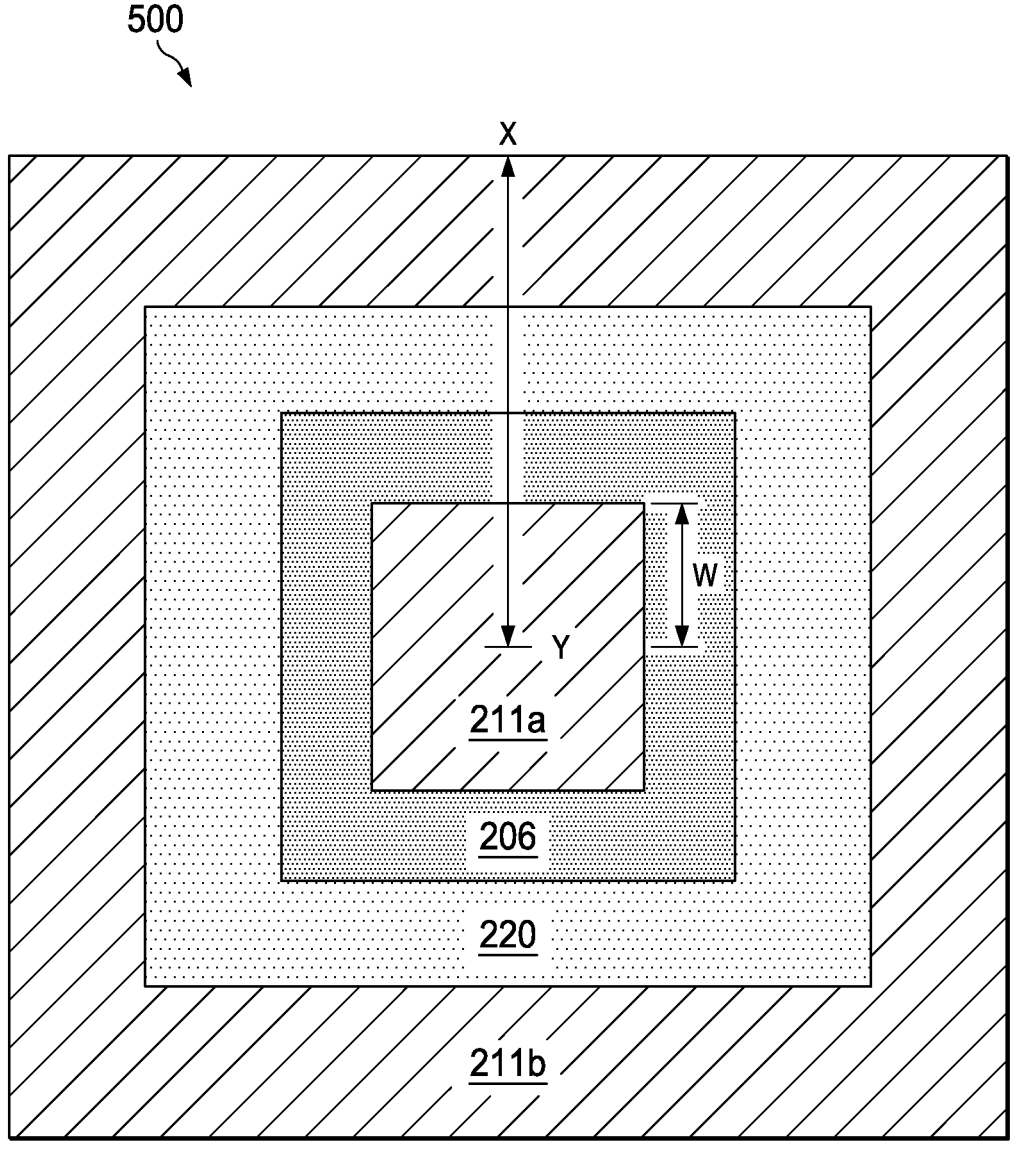
FIG. 5A illustrates a top view of a closed cell layout according to another embodiment of the lateral surface gate vertical field effect transistor of FIG. 2.

FIG. 5A illustrates a top view of a closed cell layout 500 according to another embodiment of the lateral surface gate vertical field effect transistor of FIG. 2. Unlike in the closed cell layout 400, in the closed cell layout 500 the PBODY 220 and the trench 211b are formed around the trench 211a. For completeness, the width W is drawn with respect to trench 211a; and the cross section delineating between points X and Y is drawn from the midpoint of the trench 211a.

Figure 5B:
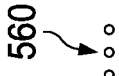
FIG. 5B illustrates a top view showing a cell placement pattern of the closed cell layout of FIG. 5A.

FIG. 5B illustrates a top view showing a cell placement pattern 550 of the closed cell layout 500 of FIG. 5A. The cell placement pattern 550 includes closed cell layout instances 500a-f duplicating cell layout 500. As indicated by the ellipses 560 and 562 there can be greater than six instances 500a-f. As one of ordinary skill in the art may appreciate, there can be greater or fewer than six instances 500a-f based, at least in part, upon the maximum specified drain-to-source current and/or upon the maximum specified on resistance Rdson.

Figure 6:
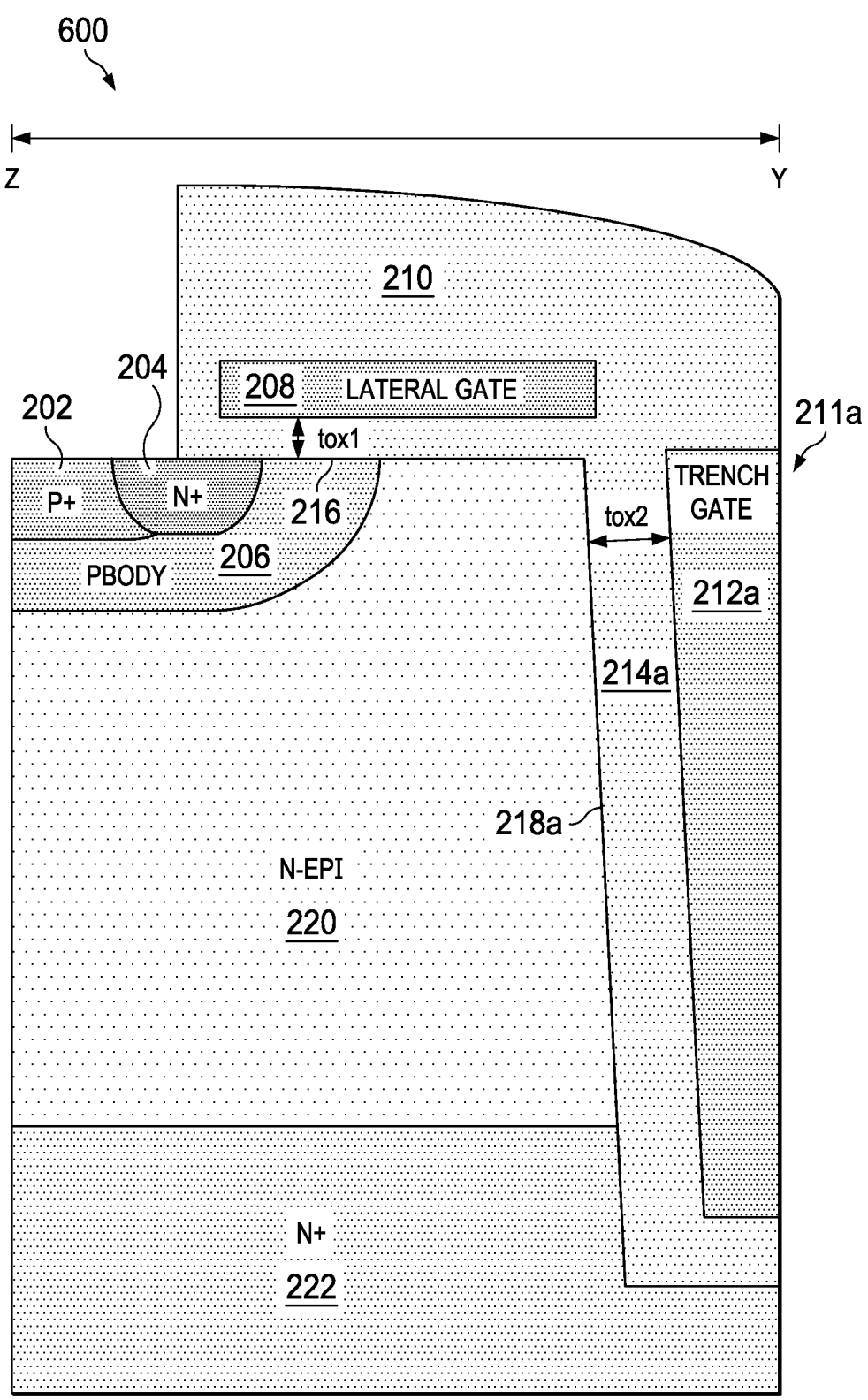
FIG. 6 illustrates a cross section of an active cell of a lateral surface gate vertical field effect transistor with adjustable output capacitance according to another embodiment.

FIG. 6 illustrates a cross section of an active cell 600 of a lateral surface gate vertical field effect transistor 102 according to another embodiment. Active cell 600 is similar to active cell 200 except it excludes trench 211b.

Figure 7A:
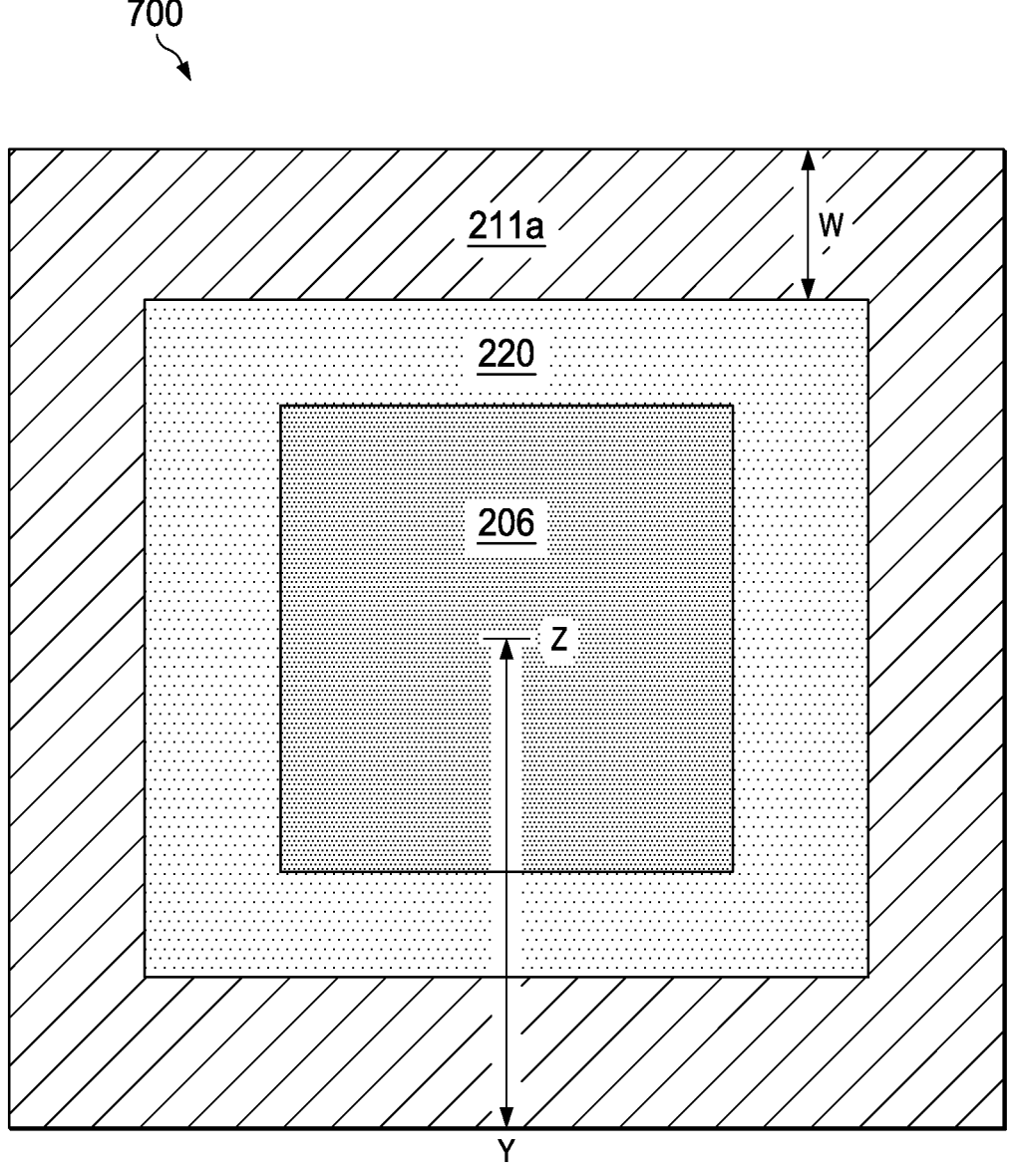
FIG. 7A illustrates a top view of a closed cell layout according to an embodiment of the lateral surface gate vertical field effect transistor of FIG. 6.

FIG. 7A illustrates a top view of a closed cell layout 700 according to an embodiment of the lateral surface gate vertical field effect transistor of FIG. 6. The closed cell layout 400 includes trench 211a of width W and the PBODY diffusion 206 drawn with respect to the N-EPI layer 220. For reference the cross section delineated from point Z to point Y may correspond with the cross section of active cell 600.

Figure 7B:
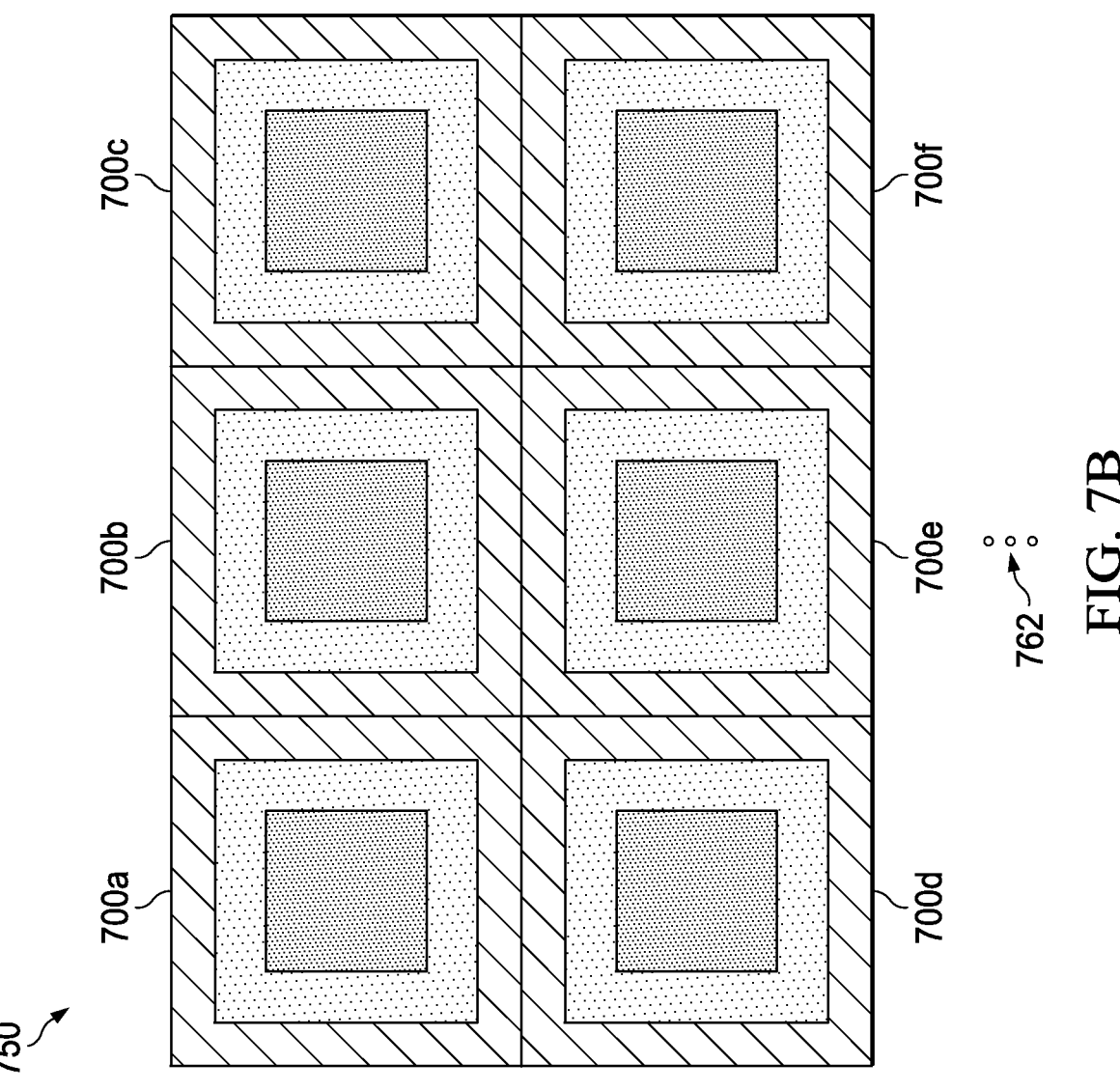
FIG. 7B illustrates a top view showing a cell placement pattern of the closed cell layout of FIG. 7A.

FIG. 7B illustrates a top view showing a cell placement pattern 750 of the closed cell layout 700. The cell placement pattern 750 includes closed cell layout instances 700a-f duplicating cell layout 700. As indicated by the ellipses 770 and 762 there can be greater than six instances 700a-f. As one of ordinary skill in the art may appreciate, there can be greater or fewer than six instances 700a-f based, at least in part, upon the maximum specified drain-to-source current and/or upon the maximum specified on resistance Rdson.

Figure 7C:
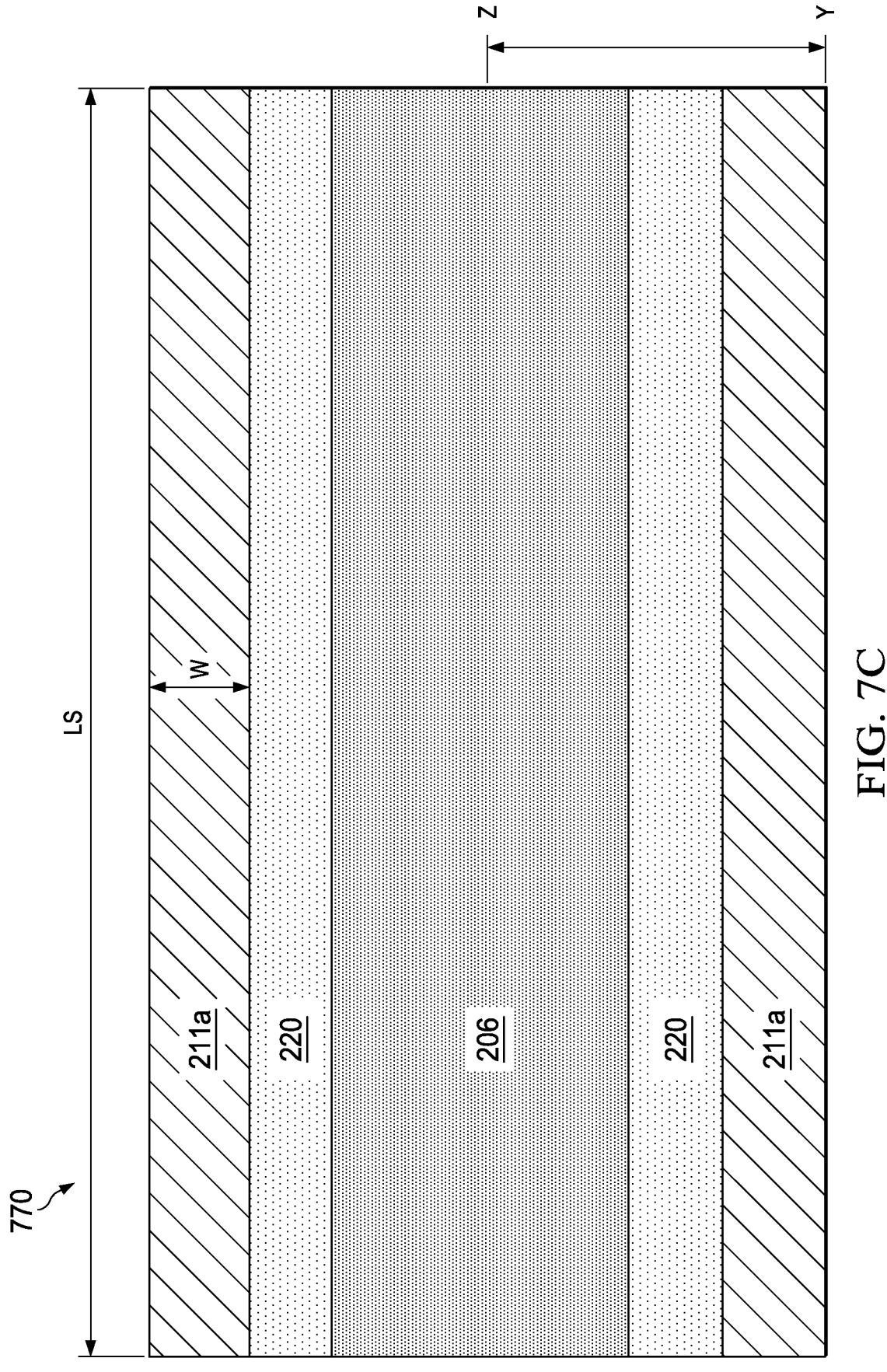
FIG. 7C illustrates a top view of a partial stripe cell layout according to an embodiment of the lateral surface gate vertical field effect transistor of FIG. 6.

FIG. 7C illustrates a top view of a partial stripe cell layout 770 according to an embodiment of the lateral surface gate vertical field effect transistor 102. The partial stripe cell layout 770 includes the trenches 211a-b and the PBODY diffusion 206 drawn with respect to the N-EPI layer 220. For reference a cross section delineated from point Z to point Y may correspond with the cross section of active cell 600 shown in FIG. 6. As illustrated, the trenches 211a-b with PBODY diffusion 206 extend a distance LS across; and the trench 211a may have a width W. In some embodiments the width W may be between three hundred nanometers (300 nm) and one point two microns (1.2 um). For instance, in one embodiment the width W may be seven hundred and fifty nanometers (750 nm).

Figure 8:
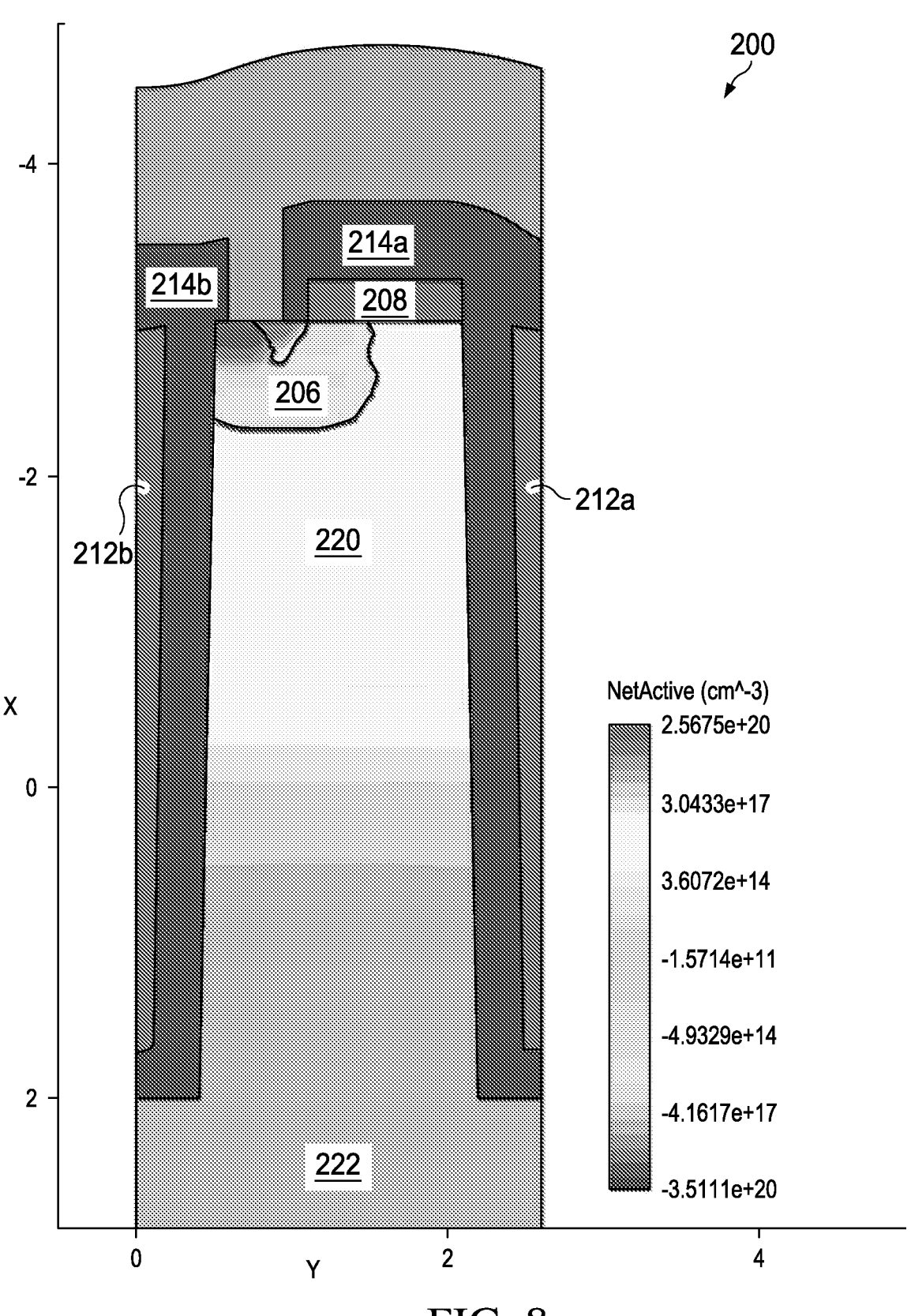
FIG. 8 illustrates a simulated active cell of a lateral surface gate vertical field effect transistor according to an embodiment.

FIG. 8 illustrates a simulated active cell 200 of a lateral surface gate vertical field effect transistor according to an embodiment. The simulated active cell 200 comprises a surface polysilicon gate (e.g., a lateral gate 208 and gate oxide 210 of thickness tox1). The gate oxide thickness (i.e., the thickness tox1) may have a value between one hundred angstroms and two hundred and fifty angstroms (e.g., one hundred and forty angstroms); and the oxide thickness tox2 of oxides 214a-b may be between 0.2 microns and 0.3 microns. The active cell 200 may be configured for forty volt operation (i.e., a maximum drain-to-source voltage of forty volts).

Figure 9:
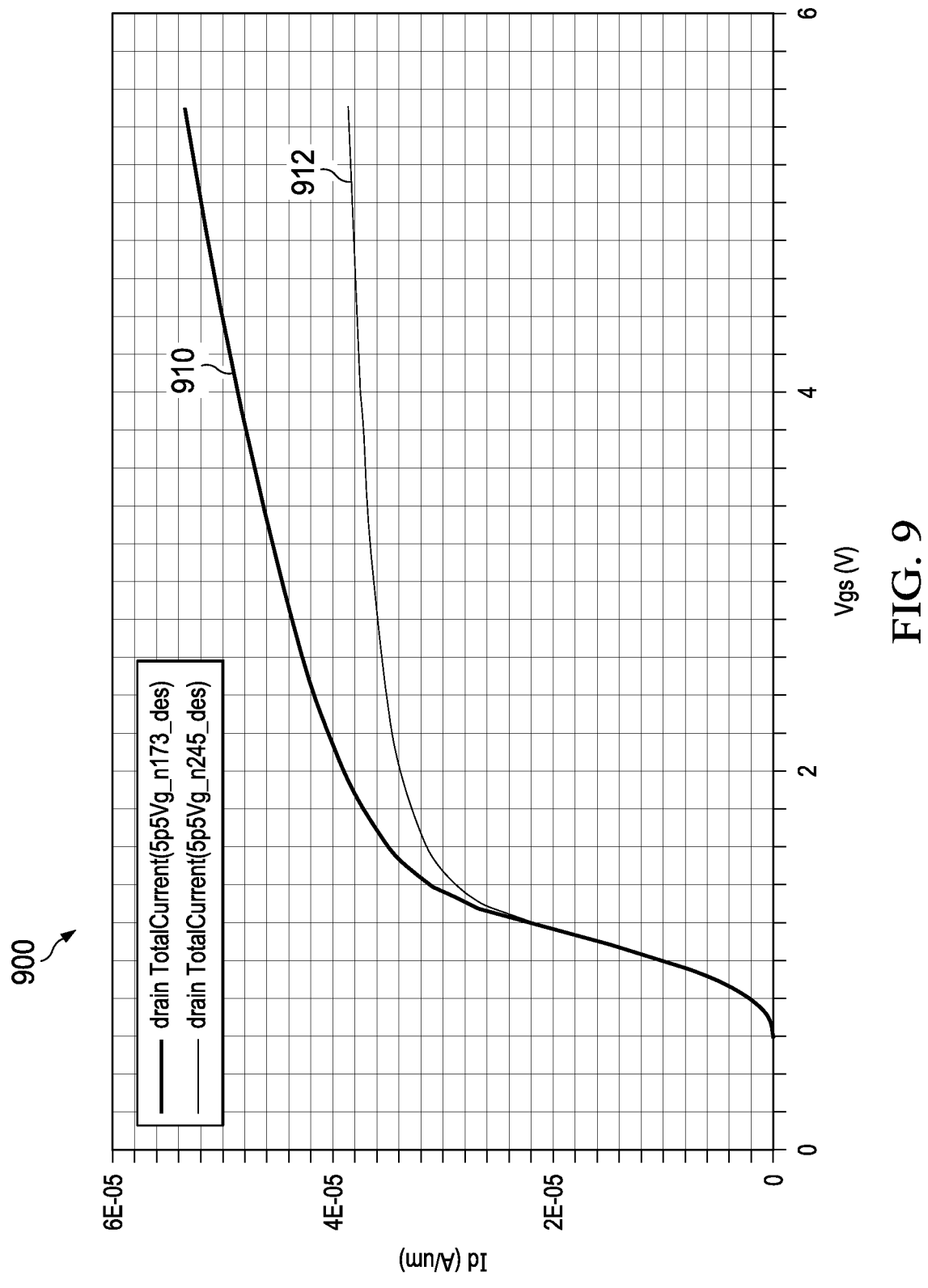
FIG. 9 illustrates simulation results of the embodiment of FIG. 8.

FIG. 9 illustrates simulation results 900 of the embodiment of FIG. 8. Simulations results 900 include plots 910 and 912 of total drain current in amperes per micron (A/um) as a function of applied gate-to-source voltage in volts (V). Additionally, simulated drain-to-source voltage may be constant while gate-to-source voltage is varied.

Plot 910 corresponds with an embodiment wherein the lateral gate 208 and the trench gates 212a-b are electrically coupled so that the gate-to-source voltage is applied to both the lateral gate 208 and the trench gates 212a-b. Plot 912 corresponds to an embodiment wherein the trench gates 212a-b have a constant potential equal to or substantially equal to ground (i.e., zero volts) independent of the applied gate-to-source voltage.

As illustrated by the simulation results 900, the embodiment of plot 910 may provide more current as compared to the embodiment of plot 912. Alternatively, and additionally, plot 910 may indicate improved on-resistance Rdson. For instance, comparison of plots 910 and 912 may indicate a simulated on-resistance Rdson improvement (i.e., reduction) of approximately thirty percent when the lateral gate 208 is electrically coupled to the trench gates 212a-b.

Figure 10A:
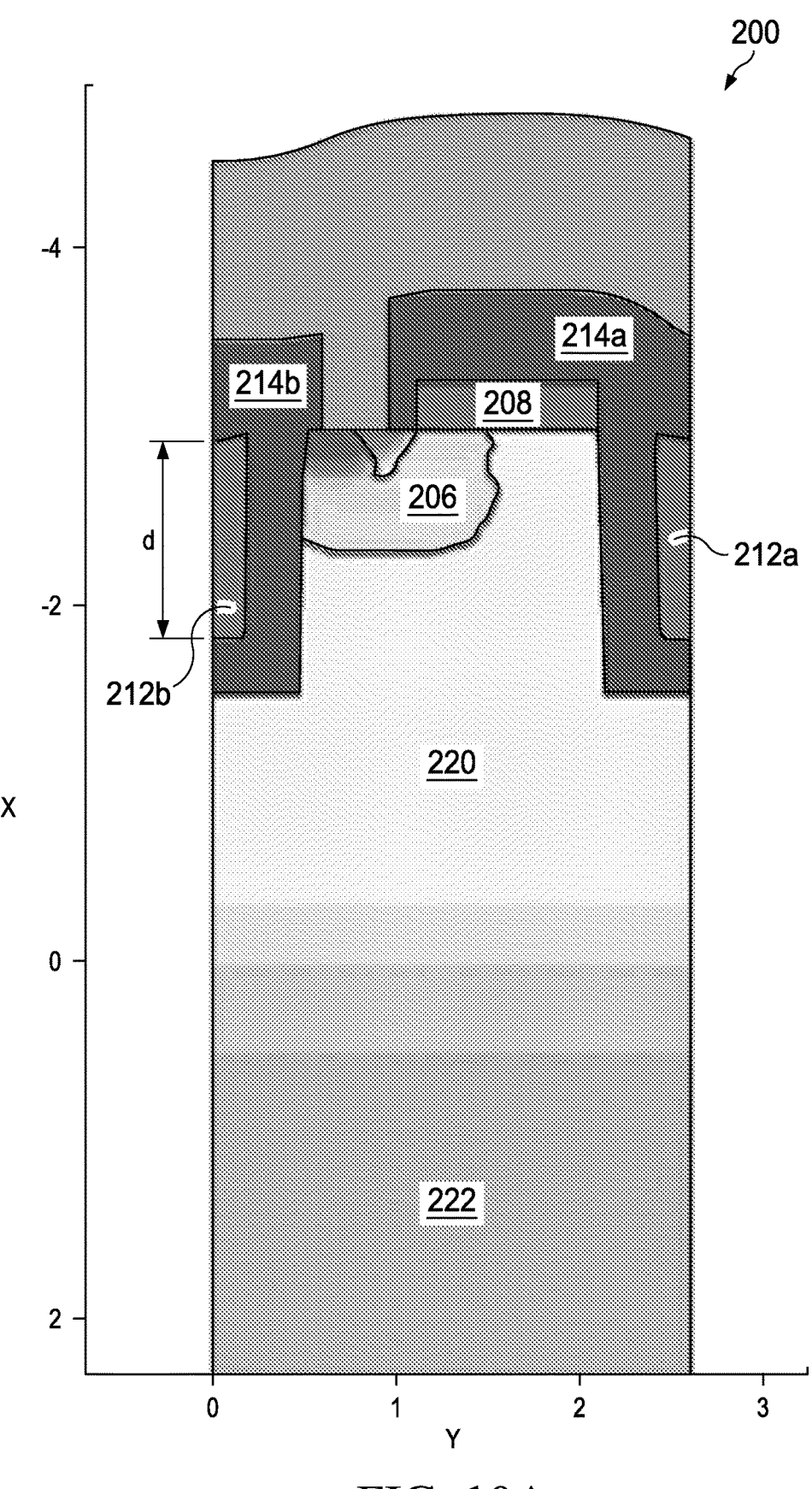
FIG. 10A illustrates a simulated active cell according to a first embodiment.

FIG. 10A illustrates a simulated active cell 200 according to a first embodiment. The first embodiment may correspond to an active cell 200 wherein the trench gates 212a-b extend a depth d of one and one-half microns (1.5 um) into the N-EPI layer 220.

Figure 10B:
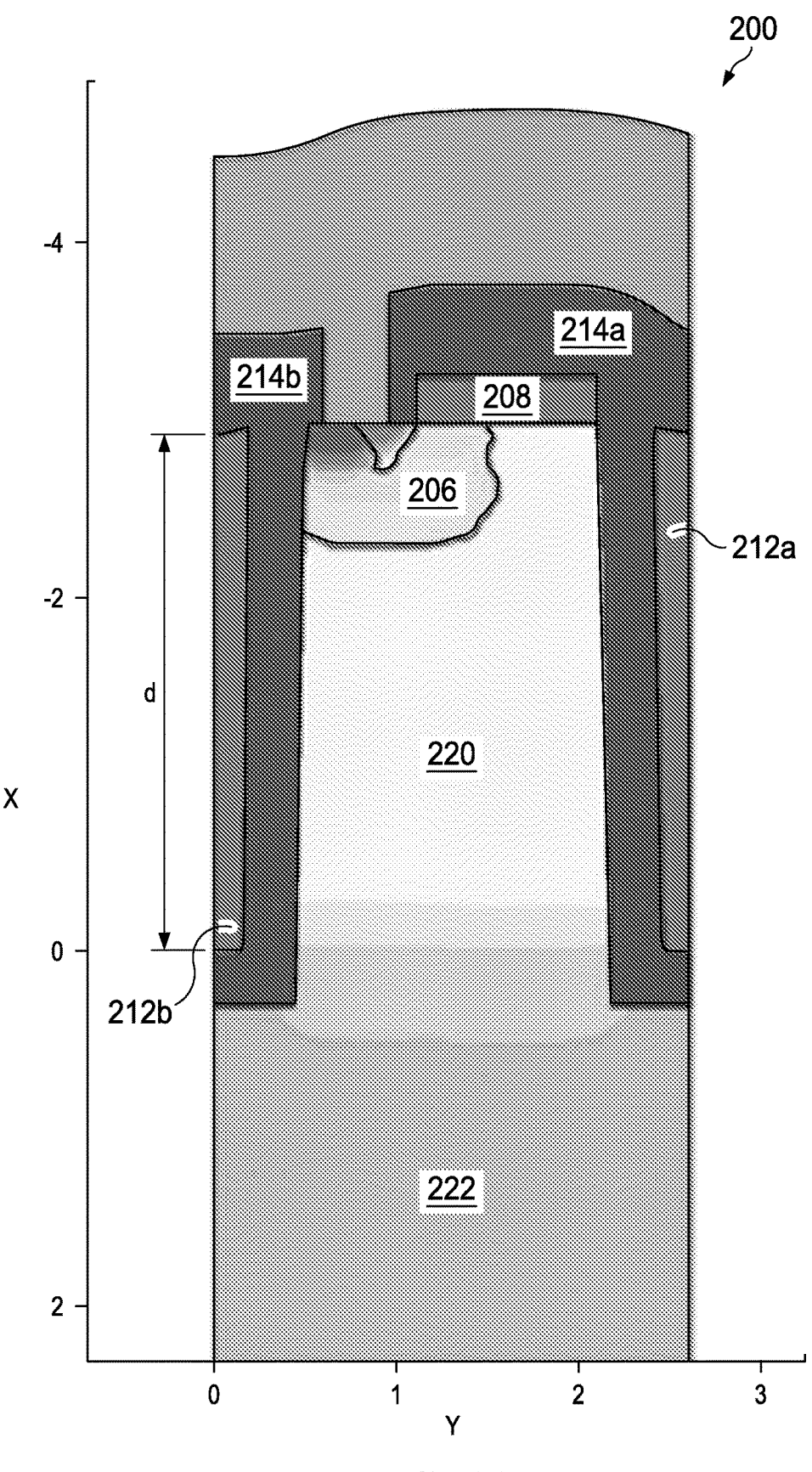
FIG. 10B illustrates a simulated active cell according to a second embodiment.

FIG. 10B illustrates a simulated active cell 200 according to a second embodiment. The second embodiment may correspond to an active cell 200 wherein the trench gates 212a-b extend a depth d of three microns (3 um) into the N-EPI layer 220 to the N+ substrate 222.

Figure 10C:
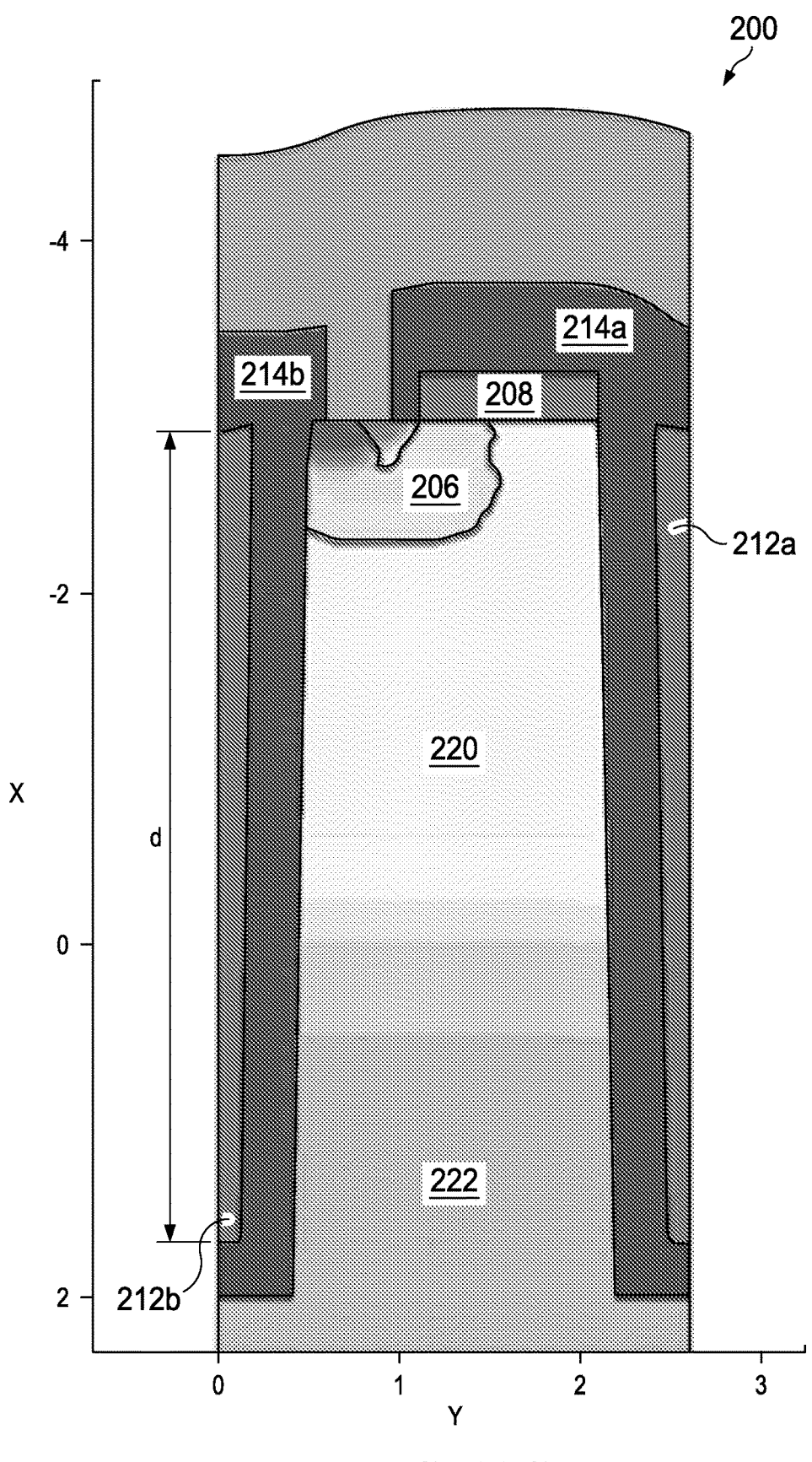
FIG. 10C illustrates a simulated active cell according to a third embodiment.

FIG. 10C illustrates a simulated active cell according to a third embodiment. The third embodiment may correspond to an active cell 200 wherein the trench gates 212a-b extend a depth d of five microns (sum) into the N-EPI layer 220 and further into the N+ substrate 222.

Figure 10D:
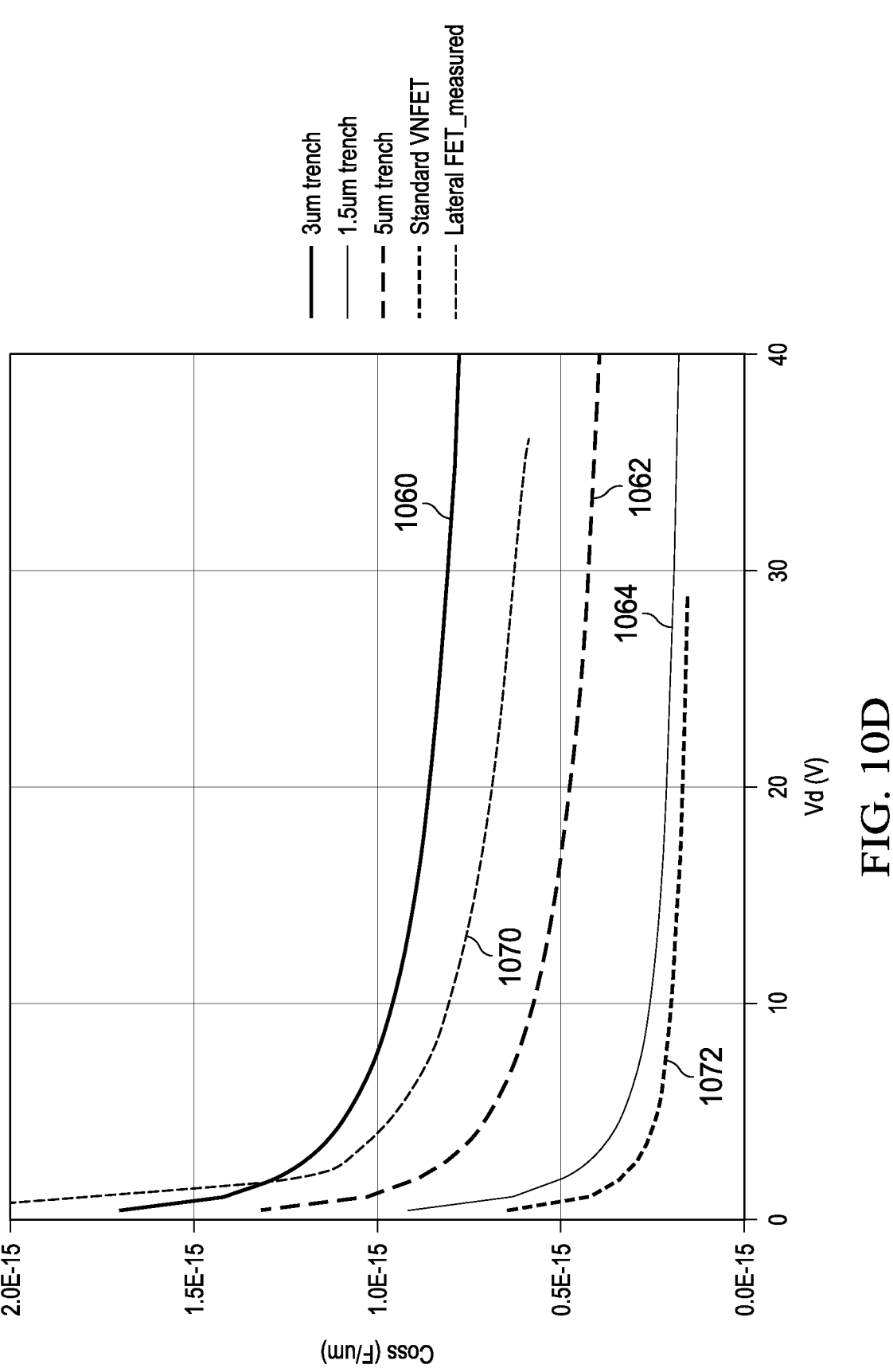
FIG. 10D illustrates simulated output capacitance versus voltage according to the embodiments of FIGS. 10A-10C.

FIG. 10D illustrates simulated output capacitance Coss versus drain voltage Vd according to the embodiments of FIGS. 10A-10C. Plots 1064, 1062, and 1060 may correspond with the first, second, and third embodiments of FIGS. 10A, 10B, and 10C, respectively. Plots 1060, 1062, and 1064 show that the output capacitance Coss in farads per micron (F/um) may be adjusted by varying the depth d. For instance, when the drain voltage Vd is ten volts, the output capacitance Coss may be adjusted to approximately 1.0E−15 farads per micron by varying the depth d to be equal to five microns. Alternatively, Coss may be adjusted to much less than 5.0E−16 farads per micron by varying the depth d to be equal to one point five microns.

For completeness FIG. 10D also includes plots 1070 and 1072 corresponding with a lateral field effect transistor and a vertical field effect transistor, respectively.

Figure 11:
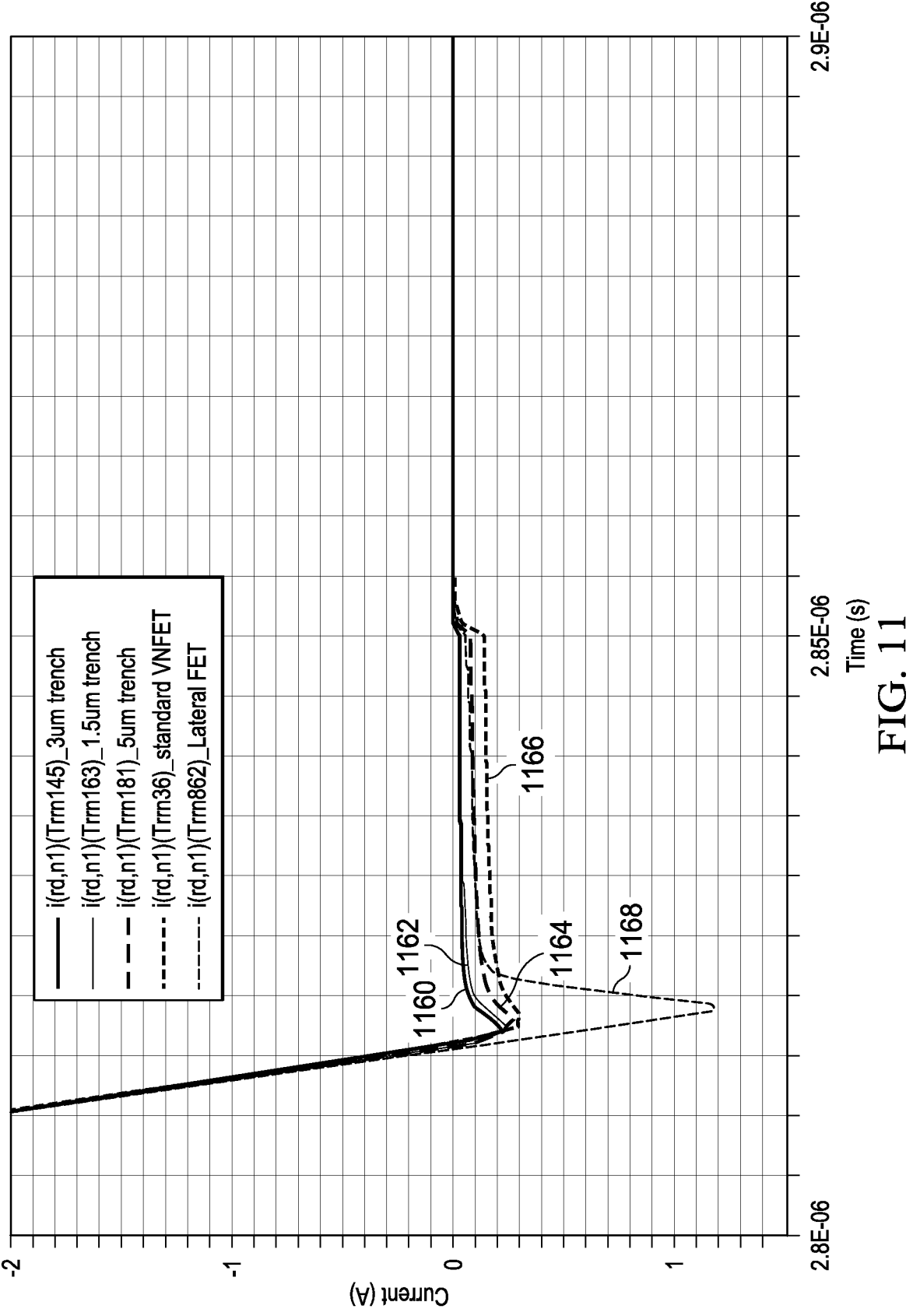
FIG. 11 illustrates simulated reverse recovery characteristics versus time according to trench depth embodiments.

FIG. 11 illustrates simulated reverse recovery characteristics of current versus time according to the embodiments of FIGS. 10A-10C. Plots 1162, 1164, and 1166 may correspond with the first, second, and third embodiments of FIGS. 10A, 10B, and 10C, respectively.

For completeness FIG. 11 also includes plots 1160 and 1168 corresponding with a vertical field effect transistor and a lateral field effect transistor, respectively.

The above description of illustrated examples of the present disclosure, including what is described in the Abstract, are not intended to be exhaustive or to be limitation to the precise forms disclosed. While specific embodiments of a lateral surface gate vertical field effect transistor with adjustable output capacitance are described herein for illustrative purposes, various equivalent modifications are possible without departing from the broader spirit and scope of the present disclosure. Indeed, it is appreciated that the specific example device cross sections are provided for explanation purposes and that other embodiments, materials, both N-channel and P-channel processes may also be employed in accordance with the teachings herein.

In one aspect a vertical field effect transistor (e.g., lateral surface gate vertical field effect transistor 102) comprises a substrate (e.g., N+ substrate 222), a drift region (e.g., N-EPI layer 220), at least one active cell (e.g., at least one active cell 200 and/or 600). The drift region may be the N-EPI layer 220. The N-EPI layer 220 is formed on the substrate (e.g., the N+ substrate 222).

The at least one active cell comprises a trench gate (e.g., trench gate 212a and/or trench gate 212b) and a lateral gate (e.g., lateral gate 208). The trench gate is configured to modulate a conductivity of the drift region. For instance, the trench gate 212a may modulate a conductivity of the N-EPI layer 220 at the trench interface 218a. The trench gate has a controllable depth (e.g., depth d) which may be adjusted to determine, at least in part, an output capacitance (e.g., see for instance, FIGS. 10A-D). The lateral gate 208 is configured to modulate a surface channel (i.e., a surface channel formed at the interface 216 in the PBODY diffusion 206).

As discussed with regards to FIGS. 10A-10C, the trench gate may extend into the drift region (i.e., into the N-EPI layer 220). For instance, the depth d can be 1.5 microns as shown in FIG. 10A and/or five microns as shown in FIG. 10C. Also, the trench gate may also extend into the substrate (i.e., the N+ substrate 222) as shown in at least FIG. 10C.

The at least one active cell can comprise a closed cell pattern (e.g., any one of closed cell layouts 400, 500, 700). The vertical field effect transistor can comprise a second trench gate 212b. The second trench gate may also modulate conductivity of the drift region (N-EPI layer 220) at the trench interface 218b.

The trench gate and the lateral gate may be electrically coupled.

The trench gate oxide thickness (i.e., the oxide thickness tox2) may be greater than the lateral gate oxide thickness (i.e., the gate oxide thickness tox1).

The lateral gate may be configured to induce an inversion region in a surface channel formed at the interface 216. The trench gate may be configured to induce an accumulation region in the N-EPI layer 220.

The substrate (i.e., the N+ substrate 222) may comprise a highly doped N-type material. The drift region (i.e., the N-EPI layer 220) may comprise a lightly doped N-type material. The lightly doped N-type material can be graded. The N-EPI layer 220 can have a graded doping profile.

In another aspect a field effect transistor (i.e., a lateral surface gate vertical field effect transistor 102) comprises: a drift region (e.g., an N-EPI layer 220), a body (e.g., PBODY diffusion 206), a source (e.g., an N-type source diffusion 204), a trench gate 212a, a lateral gate 208. The drift region (i.e., N-EPI layer 220) is layered between a substrate (e.g., N+ substrate 222) and a surface of an active cell (e.g., surface of active cell 200, 600). The body is diffused at the surface. The source is diffused into the body. The trench gate extends into the drift region and is configured to modulate a conductivity of the drift region. The trench gate has adjustable depth d. The lateral gate is disposed above the body at the surface and extends laterally between the source and the trench gate 212*a*.

The adjustable depth d may be configured to vary an output capacitance Coss as a function of depth d (e.g., plots 1060, 1062, 1064).

The field effect transistor (i.e., lateral surface gate vertical field effect transistor 102) may be an N-channel field effect transistor. As one of ordinary skill in the art may appreciate, the concepts may be applied in a complementary P-channel process, and the field effect transistor may, instead, be a P-channel field effect transistor. The field effect transistor may be a Silicon field effect transistor.

In another aspect a cascode device 100 comprises a high voltage depletion mode device (i.e., high voltage device 101) and a low voltage metal oxide field effect transistor (i.e., lateral surface gate vertical field effect transistor 102). The low voltage metal oxide field effect transistor is electrically coupled in cascode with the high voltage depletion mode device. The low voltage metal oxide field effect transistor comprises at least one trench gate 212*a* and at least one lateral gate 208. The at least one trench gate has controllable depth (i.e., depth d). The depth d is varied to adjust an output capacitance Coss. The at least one lateral gate is configured to modulate a surface channel formed at the interface 216.

The high voltage depletion mode device can be a gallium nitride high electron mobility transistor. The high voltage depletion mode device can be a silicon carbide field effect transistor. The high voltage depletion mode device can be a silicon carbide junction field effect transistor.

Although the present invention is defined in the claims, it should be understood that the present invention can alternatively be defined in accordance with the following examples:

Example 1. A vertical field effect transistor comprising: a substrate; a drift region formed on the substrate; and at least one active cell. The at least one active cell comprises a trench gate and a lateral gate. The trench gate is configured to modulate a conductivity of the drift region; and the trench gate has a controllable depth adjusted to determine, at least in part, an output capacitance of the at least one active cell. The lateral gate is configured to modulate a surface channel of the at least one active cell.

Example 2. The vertical field effect transistor of example 1, wherein the trench gate extends into the drift region.

Example 3. The vertical field effect transistor of any of the preceding examples, wherein the trench gate extends into the substrate.

Example 4. The vertical field effect transistor of any of the preceding examples, wherein the at least one active cell comprises a closed cell pattern.

Example 5. The vertical field effect transistor of any of the preceding examples, further comprising a second trench gate configured to modulate the conductivity of the drift region.

Example 6. The vertical field effect transistor of any of the preceding examples, wherein the trench gate and the lateral gate are electrically coupled.

Example 7. The vertical field effect transistor of any of the preceding examples, wherein a trench gate oxide thickness is greater than a lateral gate oxide thickness.

Example 8. The vertical field effect transistor of any of the preceding examples, wherein the lateral gate is configured to induce an inversion region.

Example 9. The vertical field effect transistor of any of the preceding examples, wherein the trench gate is configured to induce an accumulation region.

Example 10. The vertical field effect transistor of any of the preceding examples, wherein the substrate comprises a highly doped N-type material; and the drift region comprises a lightly doped N-type material.

Example 11. The vertical field effect transistor of any of the preceding examples, wherein the lightly doped N-type material is graded.

Example 12. A field effect transistor comprising: a drift region layered between a substrate and a surface of an active cell; a body diffused at the surface; a source diffused into the body; a trench gate extending into the drift region; and a lateral gate disposed above the body at the surface and extending laterally between the source and the trench gate. The trench gate is configured to modulate a conductivity of the drift region; and the trench gate has an adjustable depth.

Example 13. The field effect transistor of any of the preceding examples, wherein the lateral gate and the trench gate are electrically coupled.

Example 14. The field effect transistor of any of the preceding examples, wherein the adjustable depth is configured to vary an output capacitance of the active cell as a function of the adjustable depth.

Example 15. The field effect transistor of any of the preceding examples, wherein the trench gate extends into the substrate.

Example 16. The field effect transistor of any of the preceding examples, wherein the field effect transistor is an N-channel field effect transistor.

Example 17. The field effect transistor of any of the preceding examples, wherein the field effect transistor is a P-channel field effect transistor.

Example 18. The field effect transistor of any of the preceding examples, wherein the field effect transistor is a Silicon field effect transistor.

Example 19. A cascode device comprising: a high voltage depletion mode device; and a low voltage metal oxide field effect transistor electrically coupled in cascode with the high voltage depletion mode device. The low voltage metal oxide field effect transistor comprises at least one trench gate and at least one lateral gate. The at least one trench gate has a controllable depth varied to adjust an output capacitance of the low voltage metal oxide field effect transistor. The at least one lateral gate is configured to modulate a surface channel of the low voltage metal oxide field effect transistor.

Example 20. The cascode device of any of the preceding examples, wherein the high voltage depletion mode device is a gallium nitride high electron mobility transistor.

Example 21. The cascode device of any of the preceding examples, wherein the high voltage depletion mode device is a silicon carbide field effect transistor.

Example 22. The cascode device of any of the preceding examples, wherein the high voltage depletion mode device is a silicon carbide junction field effect transistor.

What is claimed is:

1. A vertical field effect transistor comprising:
a substrate;
a drift region formed on the substrate;

at least one active cell comprising:

a first trench gate and a second trench gate configured to modulate a conductivity of the drift region, the first trench gate and the second trench gate having a controllable depth adjusted to determine, at least in part, an output capacitance of the at least one active cell;

a lateral gate configured to modulate a surface channel of the at least one active cell;

a first trench along a perimeter of a closed cell layout; and a second trench at a center of the closed cell layout.

2. The vertical field effect transistor of claim 1, wherein the first trench gate and the second trench gate extend into the drift region.

3. The vertical field effect transistor of claim 1, wherein the first trench gate and the second trench gate extend into the substrate.

4. The vertical field effect transistor of claim 1, wherein the first trench gate, the second trench gate, and the lateral gate are electrically coupled.

5. The vertical field effect transistor of claim 1, wherein a trench gate oxide thickness is greater than a lateral gate oxide thickness.

6. The vertical field effect transistor of claim 1, wherein the lateral gate is configured to induce an inversion region.

7. The vertical field effect transistor of claim 1, wherein the first trench gate and the second trench gate are configured to induce an accumulation region.

8. The vertical field effect transistor of claim 1, wherein the substrate comprises a highly doped N-type material; and the drift region comprises a lightly doped N-type material.

9. The vertical field effect transistor of claim 8, wherein the lightly doped N-type material is graded.

10. The vertical field effect transistor of claim 1, wherein the first trench comprises the first trench gate and the second trench comprises the second trench gate.

11. A field effect transistor comprising:

a drift region layered between a substrate and a surface of an active cell comprising a closed cell layout;

a body diffused at the surface;

a source diffused into the body;

a first trench gate and a second trench gate extending into the drift region and configured to modulate a conductivity of the drift region, the first trench gate and the second trench gate having an adjustable depth; and a lateral gate disposed above the body at the surface and extending laterally;

a first trench along a perimeter of the closed cell layout; and a second trench at a center of the closed cell layout.

12. The field effect transistor of claim 11, wherein the lateral gate, the first trench gate, and the second trench gate are electrically coupled.

13. The field effect transistor of claim 11, wherein the adjustable depth is configured to vary an output capacitance of the active cell as a function of the adjustable depth.

14. The field effect transistor of claim 11, wherein the first trench gate and the second trench gate extend into the substrate.

15. The field effect transistor of claim 11, wherein the field effect transistor is an N-channel field effect transistor.

16. The field effect transistor of claim 11, wherein the field effect transistor is a P-channel field effect transistor.

17. The field effect transistor of claim 11, wherein the field effect transistor is a Silicon field effect transistor.

18. The field effect transistor of claim 11, wherein the first trench comprises the first trench gate and the second trench comprises the second trench gate.

19. A cascode device comprising:

a high voltage depletion mode device;

a low voltage metal oxide field effect transistor electrically coupled in cascode with the high voltage depletion mode device, the low voltage metal oxide field effect transistor comprising:

a first trench gate and a second trench gate having a controllable depth, the controllable depth varied to adjust an output capacitance of the low voltage metal oxide field effect transistor;

a lateral gate configured to modulate a surface channel of the low voltage metal oxide field effect transistor;

a closed cell layout comprising: a first trench and a second trench, the second trench at a center of the closed cell layout.

20. The cascode device of claim 19, wherein the high voltage depletion mode device is a gallium nitride high electron mobility transistor.

21. The cascode device of claim 19, wherein the high voltage depletion mode device is a silicon carbide field effect transistor.

22. The cascode device of claim 19, wherein the high voltage depletion mode device is a silicon carbide junction field effect transistor.

23. The cascode device of claim 19, wherein the first trench comprises the first trench gate and the second trench comprises the second trench gate.

24. The cascode device of claim 23, wherein the first trench is contiguously along a perimeter of the closed cell layout.

* * * * *